US012740414B2

(12) United States Patent
Lee et al.

(10) Patent No.: US 12,740,414 B2
(45) Date of Patent: Sep. 15, 2026

(54) SEMICONDUCTOR PACKAGING

(71) Applicant: CHUNG ANG UNIVERSITY INDUSTRY ACADEMIC COOPERATION FOUNDATION, Seoul (KR)

(72) Inventors: Hyoungsoon Lee, Seongnam-si (KR); Jung Bin In, Seoul (KR); Yunseo Kim, Incheon (KR); Daeyoung Kong, Incheon (KR); Kiwan Kim, Anyang-si (KR); Jungbae Lee, Seoul (KR)

(73) Assignee: CHUNG ANG UNIVERSITY INDUSTRY ACADEMIC COOPERATION FOUNDATION, Seoul (KR)

( * ) Notice: Subject to any disclaimer, the term of this patent is extended or adjusted under 35 U.S.C. 154(b) by 559 days.

(21) Appl. No.: 17/660,485

(22) Filed: Apr. 25, 2022

(65) Prior Publication Data

US 2022/0415751 A1 Dec. 29, 2022

(30) Foreign Application Priority Data

Jun. 23, 2021 (KR) .......................... 1020210081516

(51) Int. Cl.

| | |
|---|---|
| ***H10W 40/73*** | (2026.01) |
| ***H10W 40/25*** | (2026.01) |
| ***H10W 40/40*** | (2026.01) |
| ***H10W 76/15*** | (2026.01) |

(52) U.S. Cl.

CPC ......... *H10W 40/73* (2026.01); *H10W 40/254* (2026.01); *H10W 40/40* (2026.01); *H10W 76/15* (2026.01)

(58) Field of Classification Search

None

See application file for complete search history.

(56) References Cited

U.S. PATENT DOCUMENTS

| | | |
|---|---|---|
| 9,257,365 B2 | 2/2016 | Joshi |
| 10,553,519 B2 | 2/2020 | Morikawa et al. |
| 2003/0179596 A1 | 9/2003 | Joseph et al. |

(Continued)

FOREIGN PATENT DOCUMENTS

| | | |
|---|---|---|
| JP | 2006032490 A | 2/2006 |
| JP | 6502950 B2 | 4/2019 |

(Continued)

OTHER PUBLICATIONS

K. Ueda, S. Aichi, H. Asano, Direct formation of graphene layers on diamond by high-temperature annealing with a Cu catalyst, Diamond and Related Materials, vol. 63, 2016, pp. 148-152, ISSN 0925-9635, https://doi.org/10.1016/j.diamond.2015.10.021.*

(Continued)

*Primary Examiner* — Yara B Green
*Assistant Examiner* — Fakeha Sehar
(74) *Attorney, Agent, or Firm* — Steinfl + Bruno LLP

(57) ABSTRACT

Disclosed is a semiconductor packaging. The semiconductor packing comprises a substrate on which a semiconductor device is arranged on a front surface; a channel member disposed on a rear surface of the substrate and forming a cooling flow path through which a refrigerant moves; and a porous diamond layer covering an outer surface of the channel member.

4 Claims, 6 Drawing Sheets

1

(56) References Cited

U.S. PATENT DOCUMENTS

| | | | | |
|---|---|---|---|---|
| 2006/0012034 | A1 | 1/2006 | Kadoya et al. | |
| 2014/0252590 | A1* | 9/2014 | Gohara | H01L 23/473 257/715 |
| 2017/0287810 | A1* | 10/2017 | Morikawa | H01L 23/3735 |
| 2020/0105644 | A1* | 4/2020 | Teng | H01L 23/3677 |
| 2021/0084748 | A1* | 3/2021 | Gil | H05K 1/0271 |
| 2021/0363016 | A1* | 11/2021 | Alkhazraji | C01B 32/25 |

FOREIGN PATENT DOCUMENTS

| | | | |
|---|---|---|---|
| JP | 2020507200 | A | 3/2020 |
| KR | 102202443 | B1 | 1/2021 |

OTHER PUBLICATIONS

Methods of porous diamond deposition on porous silicon (Year: 2001).*

Office Action for Korean Patent Application No. 10-2021-0081516 filed on Jul. 23, 2021; Issue Date: Aug. 19, 2022; 7 pages (Original + English Translation).

* cited by examiner

SEMICONDUCTOR PACKAGING

CROSS-REFERENCE TO RELATED APPLICATION

This application is based on and claims priority under 35 U.S.C. § 119 to Korean Patent Application No. 10-2021-0081516, filed on Jun. 23, 2021, in the Korean Intellectual Property Office, and the disclosure of which is herein incorporated by reference in its entirety.

BACKGROUND

1. Field

The disclosure relates to a semiconductor packaging with improved flow path structure and a material so that cooling efficiency of a semiconductor may be improved by a refrigerant.

2. Description of Related Art

Recently, due to the high performance of an electronic device and the miniaturization and integration of a semiconductor device, an amount of heat generated inside the semiconductor packaging is increased. Since the heat has a fatal effect on the performance and lifespan of an electronic device, various technologies that may efficiently emit heat generated in the semiconductor packaging to the outside have been developed.

A method of attaching a heat sink to an outer surface of a semiconductor packaging among a related-art heat dissipation technology may have a problem in that a thermal interfacial material having a low thermal conductivity should be used during attachment, and heat dissipation performance is significantly reduced according to the thermal conductivity of the semiconductor packaging material.

SUMMARY

Aspects of the disclosure are to address at least the above-mentioned problems and/or disadvantages and to provide at least the advantages described below. Accordingly, an aspect of the disclosure is to provide a semiconductor packaging with improved structure and material of a flow path for increasing cooling efficiency of a semiconductor.

A semiconductor packaging according to an embodiment includes a substrate on which a semiconductor device is arranged on a front surface; a channel member disposed on a rear surface of the substrate and forming a cooling flow path through which a refrigerant moves; and a porous diamond layer covering an outer surface of the channel member.

The semiconductor packaging may further include a porous layer stacked on the diamond layer and having wettability different from the diamond layer.

A porous size of the porous layer may be different from a porous size of the diamond layer.

The semiconductor layer may further include a nano-wire layer stacked on the diamond layer.

The channel member may include a plurality of pin members disposed to be spaced apart from each other and forming the cooling flow path therebetween.

The semiconductor packaging may further include a manifold member disposed on one side of the channel member and forming a transfer flow path for communicating the refrigerant inlet and the cooling flow path, and a cross-sectional area of the transfer flow path may be greater than a cross-sectional area of the cooling flow path.

The semiconductor packaging may further include a refrigerant inlet and a refrigerant outlet formed on an outer surface of the semiconductor packaging and communicating with the cooling flow path.

The semiconductor packaging may further include a case forming an outer appearance of the semiconductor packaging, and the refrigerant inlet and the refrigerant outlet may be formed in the case.

The substrate and the channel member may be integrally formed with a same material.

BRIEF DESCRIPTION OF THE DRAWINGS

The above and other aspects, and advantages of certain embodiments of the disclosure will be more apparent from the following description taken in conjunction with the accompanying drawings, in which:

FIG. 1 is a cross-sectional diagram of a semiconductor packaging according to an embodiment of the disclosure;

The same reference numerals are used to represent the same elements throughout the drawings.

DETAILED DESCRIPTION

Examples described hereinafter are for easy understanding of the disclosure, and it should be understood that various changes can be made to examples described herein and the disclosure can be embodied in different forms. In addition, in the following description, detailed descriptions of well-known functions or configurations will be omitted since they would unnecessarily obscure the subject matters of the disclosure. In addition, it should be noted that the drawings as attached are just for easy understanding of the disclosure, and are not illustrated as really scaled, and dimensions of some elements may be exaggerated.

The terms used in the present specification and the claims are general terms identified in consideration of the functions of the various embodiments of the disclosure. However, these terms may vary depending on intention, legal or technical interpretation, emergence of new technologies, and the like of those skilled in the related art. Also, there may be some terms arbitrarily identified by an applicant. Unless there is a specific definition of a term, the term may be construed based on the overall contents and technological common sense of those skilled in the related.

Expressions such as "have," "may have," "include," "may include" or the like represent presence of a corresponding feature (for example, components such as numbers, functions, operations, or parts) and do not exclude the presence of additional features.

Since the components required for the description of each embodiment of the disclosure have been described herein, the embodiment is not limited thereto. Thus, some components may be modified or omitted and other components may be added. In addition, the components may be distributed and arranged in different independent devices.

Furthermore, although the embodiments of the disclosure will be described in detail with reference to the accompanying drawings and the contents set forth in the accompanying drawings, the disclosure is not limited to the embodiments.

Hereinafter, the disclosure will be described in greater detail with reference to the attached drawings.

Figure 1:
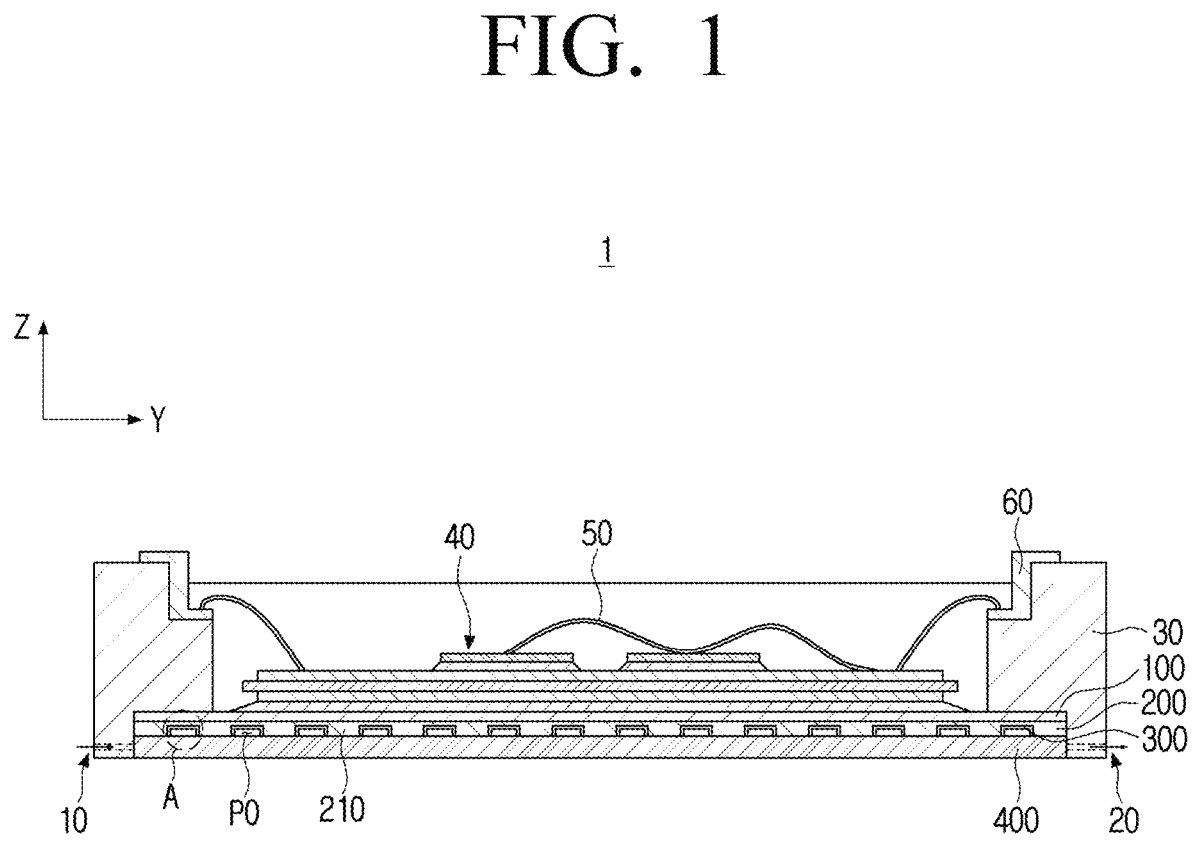
Figure 2:
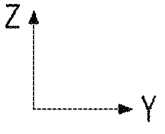
FIG. 2 is a cross-sectional diagram of an embodiment in which a refrigerant flow path is disposed at a position different from FIG. 1.
Figure 2:
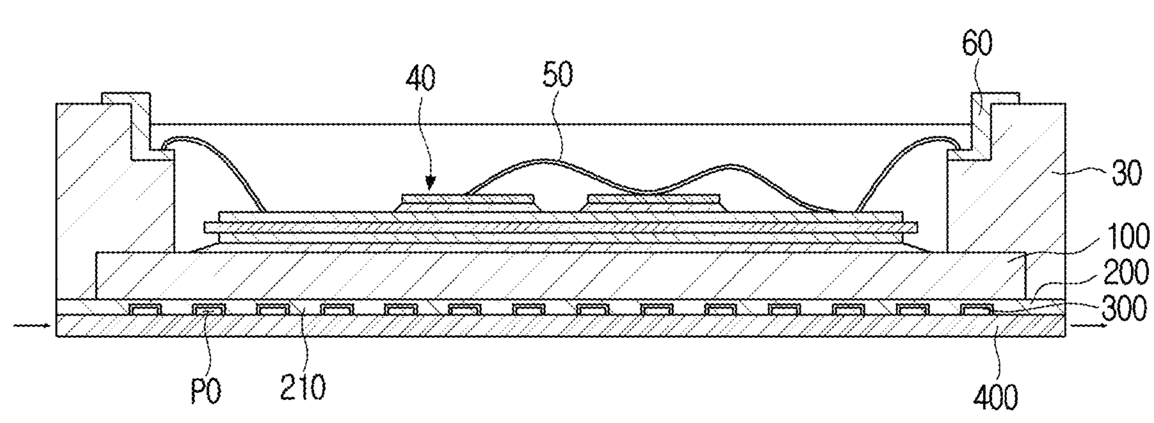
Figure 3:
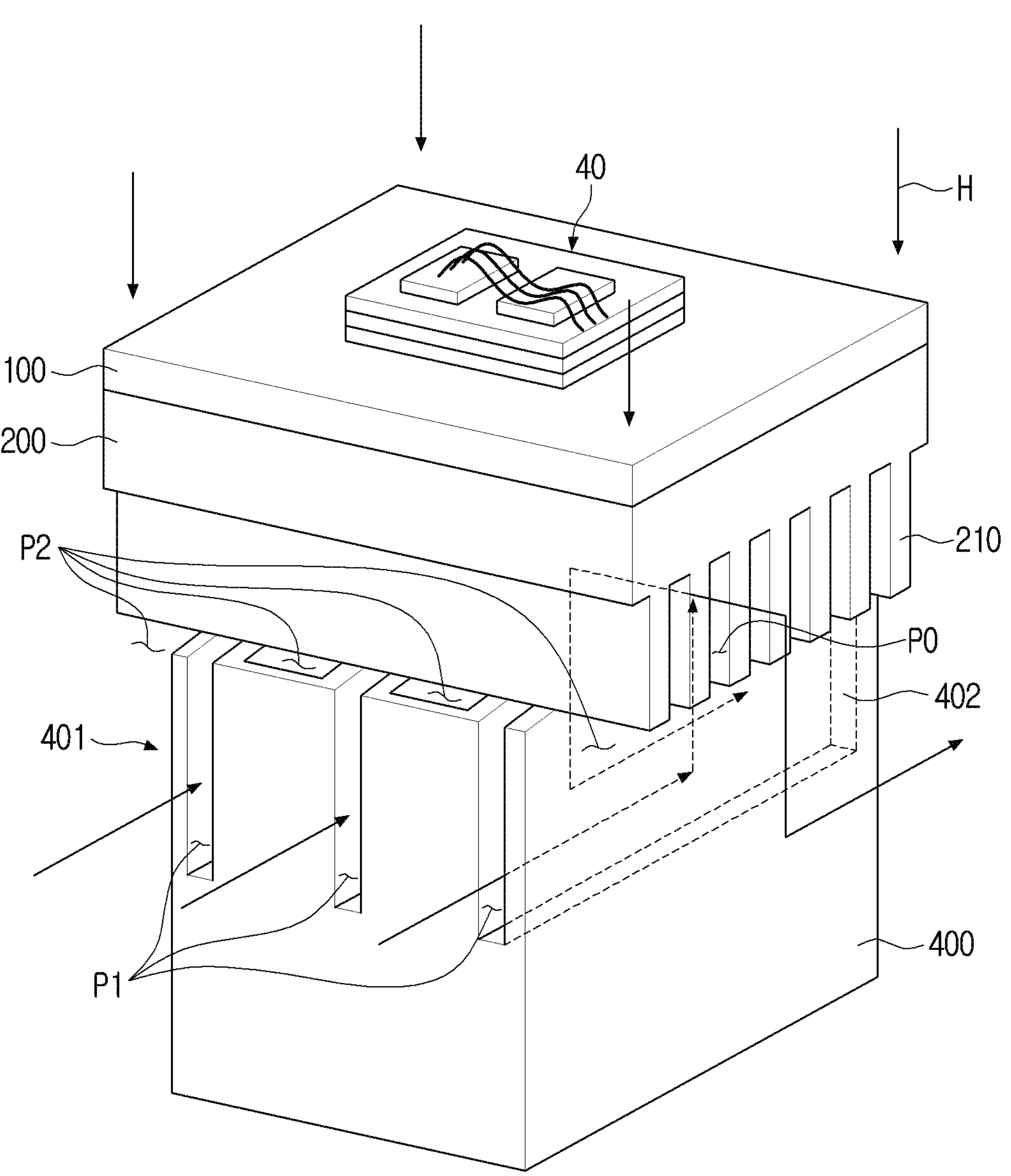
FIG. 3 is a diagram schematically illustrating a refrigerant flow path formed by a channel member and a manifold member.
Figure 4:
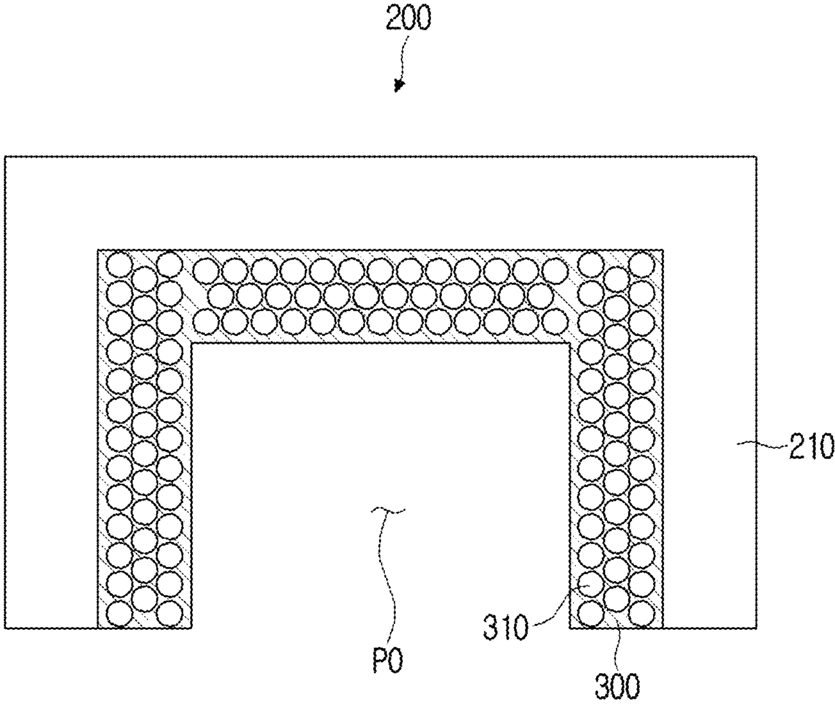
FIG. 4 is a cross-sectional view enlarging A portion of FIG. 1.

FIG. 1 is a cross-sectional diagram of a semiconductor packaging according to an embodiment of the disclosure; FIG. 2 is a cross-sectional diagram of an embodiment in which a refrigerant flow path is disposed at a position different from FIG. 1; FIG. 3 is a diagram schematically illustrating a refrigerant flow path formed by a channel member and a manifold member; FIG. 4 is a cross-sectional view enlarging A portion of FIG. 1.

Referring to FIGS. 1 to 4, a semiconductor packaging 1 according to an embodiment of the disclosure may include a refrigerant inlet 10, a refrigerant outlet 20, a case 30, a semiconductor device 40, a wire 50, a terminal 60, a substrate 100, a channel member 200, a diamond layer 300, and a manifold member 400.

The refrigerant inlet 10 and the refrigerant outlet 20 may be formed on the outer surface of the semiconductor packaging 1. The refrigerant inlet 10 and the refrigerant outlet 20 may communicate with a refrigerant pipe (not shown) disposed outside the semiconductor packaging 1.

The refrigerant may be introduced into the semiconductor packaging 1 through the refrigerant inlet 10 by a pump device (not shown) from the outside of the semiconductor packaging 1 in a low temperature state. Thereafter, the refrigerant may flow along the cooling flow path P0 and may receive heat generated inside the semiconductor packaging 1. Finally, the refrigerant may be discharged to the outside of the semiconductor packaging 1 through the refrigerant outlet 20 in a high temperature state.

The refrigerant may move along the cooling flow path P0 and may receive heat generated from the inside of the semiconductor packaging 1 and may be phase-changed from liquid to vapor, thereby absorbing more heat using latent heat. The refrigerant may be a dielectric liquid, but is not limited thereto.

The cooling flow path P0 may be embedded in the semiconductor packaging 1. Accordingly, as compared to the structure in which heat dissipation is performed from the outside of the semiconductor packaging 1, the cooling efficiency may be increased since the heat dissipation is performed in a state that thermal resistance is low in a position adjacent to the hot spot (for example, the semiconductor device 40).

Although the channel member 200 and the manifold member 400 are not necessarily embedded in the case 30, and as shown in FIG. 2, the channel member 200 and the manifold member 400 may be disposed outside the case 30. The refrigerant may absorb heat transferred from the substrate 100 while moving along the cooling flow path P0 formed by the channel member 200 disposed outside the case 30. The refrigerant inlet 10 and the refrigerant outlet 20 may be provided in at least one of the channel member 200 and the manifold member 400 instead of the case 30.

The case 30 may form the exterior of the semiconductor packaging 1. The refrigerant inlet 10 and the refrigerant outlet 20 may be formed in the case 30. However, the position of the refrigerant inlet 10 and the refrigerant outlet 20 is not limited thereto, and may be formed in the manifold member 400 defining the lower surface of the semiconductor packaging 1.

The semiconductor device 40 may be at least one of the diode, transistor, thyristor, or semiconductor field-effect-transistor (MOSFET), but the type is not limited thereto. The semiconductor device 40 may be placed on the front of the substrate 100.

The wire 50 may connect the semiconductor device 40 to the substrate 100 and the terminal 60. Referring to FIG. 1, the bonding is performed using a wire bonding method, but the embodiment is not limited thereto, and may be a flip chip bonding method or a through-silicon via (TSV) bonding method.

The channel member 200 may be disposed on the rear surface of the substrate 100 and may form a cooling flow path P0 from the refrigerant inlet 10 to the refrigerant outlet 20. Accordingly, the refrigerant introduced through the refrigerant inlet 10 flows along the cooling path P0 formed by the channel member 200, and may absorb heat generated from the semiconductor device 40 and the substrate 100.

The channel member 200 may be a configuration separate from the substrate 100 and may be coupled on a rear surface, but the embodiment is not limited thereto, and may be integrally formed with the same material as the substrate 100. The channel member 200 may be a part of the substrate 100. For example, the substrate 100 may be formed of gallium nitride (GaN) diamond, and the channel member 200 may also be a part of the substrate 100.

The channel member 200 may include a plurality of pin members 210 spaced apart from each other and forming a cooling flow path P0 therebetween. The heat H may be transmitted from the rear surface of the substrate 100 to the front surface of the channel member 200, and the heat passing through the channel member 200 may be transferred toward the refrigerant through the pin member 210 formed on the rear surface of the channel member 200.

Accordingly, the contact area between the pin member 210 of the channel member 200 and the refrigerant may be wider, and heat dissipation may be performed more efficiently and rapidly.

The diamond layer 300 may be formed to be porous, and may cover the outer surface of the channel member 200. The refrigerant moving along the cooling flow path P0 forming the channel member 200 may be in contact with the porous diamond layer 30.

The diamond has a very high thermal conductivity compared to a general metal (e.g., copper, aluminum, etc.), so that heat generated from the substrate 100 and the semiconductor device 40 may be transferred to the fluid more quickly through the diamond layer 300.

Since the diamond layer 300 is formed of a porous material including a plurality of porous holes 310, the surface of the diamond layer 300 is formed to be rough and not soft and the surface of the diamond layer 300 contacting the refrigerant may be wider, so that heat transfer to the refrigerant may be more actively performed.

A boiling delay of the refrigerant passing through the channel member 200 may be prevented by the porous diamond layer 300. That is, more heat may be effectively absorbed using latent heat by phase-changing the refrigerant at a faster time.

In addition, critical heat flux may increase, which results in increase in heat dissipation range and improvement in safety, and heat transfer efficiency may increase.

The manifold member 400 may be disposed at one side of the channel member 200 and may form transfer flow paths P1 and P2 for communicating the refrigerant inlet 10 and the cooling flow path P0. The manifold member 400 may be disposed between the channel member 200 and the refrigerant inlet 10.

The cross-sectional area of the transfer flow path P1 and P2 formed by the manifold member 400 may be greater than the cross-sectional area of the cooling flow path P0.

The manifold member 400 may form first and second transfer paths P1 and P2, which are alternately arranged in parallel with the Y-axis direction. However, the arrangement direction of the first and second transfer flow paths P1 and P2 are not be limited thereto, but may be arranged in parallel with the X-axis or the Z-axis direction.

The first transfer flow path P1 may communicate with the refrigerant inlet 10 and the second transfer flow path P2 may communicate with the refrigerant outlet 20.

One end 401 of the first transfer flow path P1 may be opened to communicate with the refrigerant inlet 10, and the other end 402 may be closed. In contrast, the one end 401 of the second transfer flow path P2 may be closed, and the other end 402 may be opened to communicate with the refrigerant outlet 20.

The refrigerant may pass through the refrigerant inlet 10 and move along the first transfer flow path P1 formed by the manifold member 400, and then may move to the cooling flow path P0 in the front (+Z) direction. Thereafter, the refrigerant received heat from the cooling flow path P0 may move to the second transfer flow path P2 in the rear (−Z direction), and may be discharged to the outside of the semiconductor packaging 1 through the refrigerant outlet 20.

Accordingly, since the refrigerant moves along the transfer flow paths P1 and P2 having a relatively large cross-sectional area, the pressure drop due to the narrow cross-sectional area of the cooling flow path P0 of the channel member 200 may be reduced, and the temperature uniformity of the semiconductor packaging 1 may be improved through uniform heat dissipation along the moving direction of the refrigerant.

Figure 5:
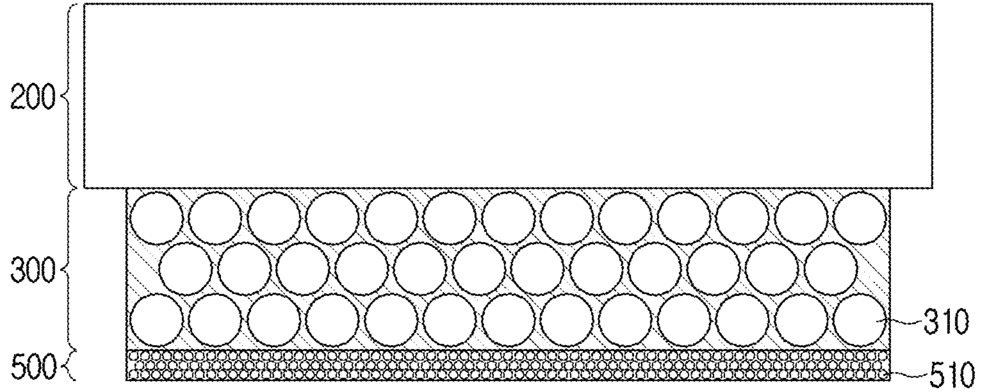
FIG. 5 is a cross-sectional view illustrating a structure in which a porous layer is stacked on a porous diamond layer.
Figure 6:
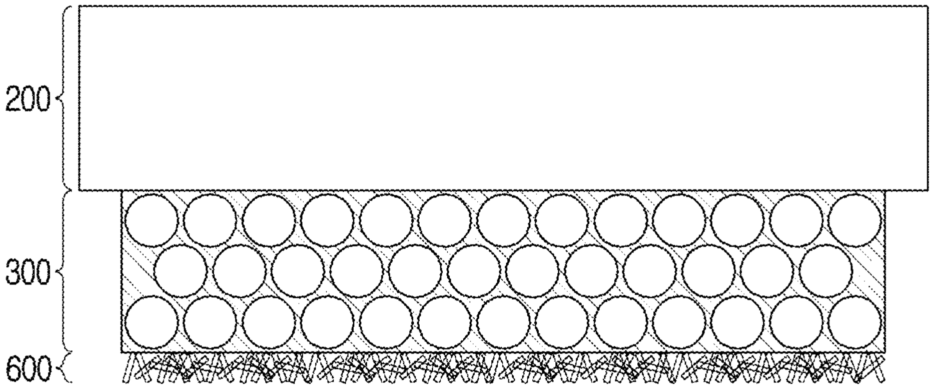
FIG. 6 is a cross-sectional diagram illustrating a structure in which a nanowire layer is stacked on a porous diamond layer.

FIG. 5 is a cross-sectional view illustrating a structure in which a porous layer is stacked on a porous diamond layer; and FIG. 6 is a cross-sectional diagram illustrating a structure in which a nanowire layer is stacked on a porous diamond layer.

Referring to FIG. 5, the semiconductor packaging 1 may further include a porous layer 500 stacked on the diamond layer 300. The porous layer 500 may be formed of at least one of copper or graphene, but a material of the porous layer 500 is not limited thereto. The porous layer 500 may have wettability different from the diamond layer 300 of a porous material. For example, the porous layer 500 may be hydrophobic, and the porous diamond layer 300 may be hydrophilic, but the embodiment is not limited thereto and may have opposite properties.

Accordingly, the heat transfer from the channel member 200 to the refrigerant may be easily performed by improving the wettability according to the hierarchical structure of the channel member 200 when the refrigerant flows along the cooling flow path P0 and is phase-changed from the liquid to the vapor.

By the porous layer 500 having the different wettability from the porous diamond layer 300, phase-changed high temperature vapor may easily move toward the refrigerant outlet 20, so it is possible to prevent a phenomenon that heat transfer is disturbed by the refrigerant that has changed into vapor.

The pore 510 size of the porous layer 500 may be different from the size of the porous holes 310 of the diamond layer 300. For example, the pore 510 size of the porous layer 500 may be smaller than the size of the porous holes 310 of the diamond layer 300, but is not limited thereto, or may be larger.

A boiling delay may be prevented by the porous diamond layer 300 and the porous layer having a hierarchical structure and critical heat flux may increase.

Referring to FIG. 6, the semiconductor packaging 1 may further include a nanowire layer 600 stacked on the diamond layer 300. The nanowire layer 600 may be formed of copper, but the material is not limited thereto and may be formed of various metals or non-metals.

Like the porous layer 500, the nanowire layer 600 may change the wettability of the channel member 200. As the nanowire layer 600 has wettability different from the diamond layer 300, high-temperature gaseous refrigerant and the low-temperature liquid refrigerant may be selectively brought into contact with the channel member 200, thereby facilitating heat transfer to the refrigerant.

While preferred embodiments of the disclosure have been shown and described, the disclosure is not limited to the aforementioned specific embodiments, and it is apparent that various modifications can be made by those having ordinary skill in the technical field to which the disclosure belongs, without departing from the gist of the disclosure as claimed by the appended claims, and such modifications are within the scope of the claims.

What is claimed is:

1. A semiconductor packaging comprising:

a substrate on which a semiconductor device is arranged on a front surface;

a channel member disposed on a rear surface of the substrate and forming a cooling flow path through which a refrigerant moves;

a porous diamond layer with a first pore size covering an outer surface of the channel member;

a porous layer with a second pore size stacked on the porous diamond layer and having wettability different from the porous diamond layer;

a refrigerant inlet and a refrigerant outlet arranged with the channel member in-between, and communicating with the cooling flow path;

a case in which the channel member is located inside; and a manifold member disposed on one side of the channel member, the manifold member configured to be in parallel with a direction of movement of the refrigerant and to form a first transfer flow path and a second transfer flow path, the first transfer flow path connecting a refrigerant inlet with the cooling flow path and the second transfer flow path connecting a refrigerant outlet with the cooling flow path;

wherein one of the porous layer and the porous diamond layer is hydrophilic and an other of the porous layer and the porous diamond layer is hydrophobic;

wherein the second pore size of the porous layer is different from the first pore size of the porous diamond layer;

wherein the refrigerant inlet and the refrigerant outlet are formed in the case;

wherein the first transfer flow path has a first end open to communicate with the refrigerant inlet and a second end closed; and wherein the second transfer flow path has a first end closed and a second end open to communicate with the refrigerant outlet.

2. The semiconductor packaging of claim 1, wherein the channel member comprises a plurality of pin members disposed to be spaced apart from each other and forming the cooling flow path therebetween.

3. The semiconductor packaging of claim 1, wherein a cross-sectional area of the first transfer flow path and a cross-sectional area of the second transfer flow path are each greater than a cross-sectional area of the cooling flow path.

4. The semiconductor packaging of claim 1, wherein the substrate and the channel member are formed with a same material.

* * * * *